Dec. 20, 1966 J. F. GIBBONS 3,293,450

TRANSFER CIRCUIT HAVING WIDE RANGE ANTILOGARITHM RESPONSE

Filed Sept. 16, 1963

INVENTOR.
JAMES F. GIBBONS

BY

Flehr and Swain

ATTORNEYS

United States Patent Office 3,293,450

Patented Dec. 20, 1966

3,293,450

TRANSFER CIRCUIT HAVING WIDE RANGE ANTILOGARITHM RESPONSE

James F. Gibbons, Palo Alto, Calif., assignor to Beckman Instruments, Inc., a corporation of California Filed Sept. 16, 1963, Ser. No. 309,144
4 Claims. (Cl. 307—88.5)

Figure 1:
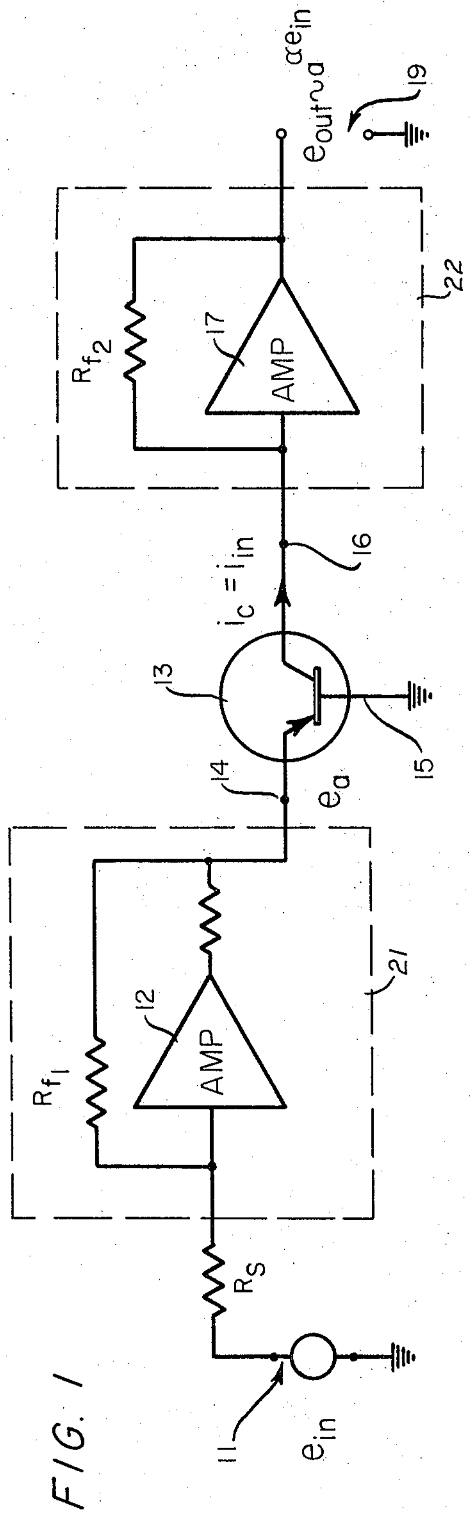

This invention relates generally to a transfer circuit and more particularly to a transfer circuit having a wide range of antilogarithm response.

In many types of analog circuits, it is often necessary to perform non-linear operations such as obtaining the antilogarithm of a voltage or current.

When using a circuit of this type with a circuit capable of taking the logarithm of voltage or current, such as that described in my copending application Serial No. 260,275, filed February 21, 1963, now Patent No. 3,237,-028, it is possible to perform multiplication, division, raising to a constant power and many other operations.

It is a general object of the present invention to provide a circuit with antilogarithm transfer response.

It is another object of the present invention to provide a circuit with antilogarithm transfer response over a wide range of values, for example, in the order of 9 or 10 decades.

It is a further object of the present invention to provide an antilogarithm transfer circuit which includes a transistor connected to receive its input from an operational amplifier and provide its output to an operational amplifier.

These and other objects of the invention will become more clearly apparent from the following description when taken in conjunction with the accompanying drawings.

Figure 2:
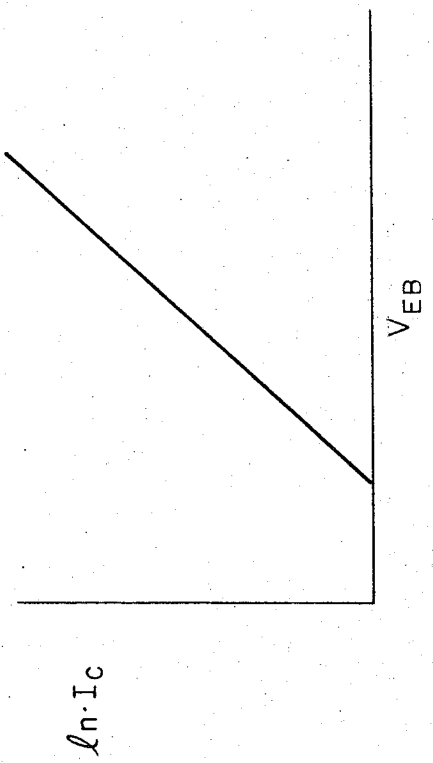

Referring to the drawings:

FIGURE 1 is a block diagram showing a circuit in accordance with the invention; and FIGURE 2 is a curve showing the relationship between collector current $I_c$ and emitter-base voltage $V_{eb}$ of a transistor.

Referring to FIGURE 1, there is shown a circuit which includes input terminals 11 to which an input voltage $e_{in}$ is applied. A resistor is connected in series between one of the input terminals and the input of an amplifier 21, 12, to represent possible source resistance which cannot be tolerated in the transistor drive circuit. The amplifier 12 is shunted with a shunting resistor $R_{f1}$ which is a feedback resistor and causes the amplifier-resistor combination to act as an operational amplifier. The output of the operational amplifier is applied to the emitter terminal 14 of transistor 13. The base terminal 15 is connected to a common voltage, for example, ground, and the collector terminal 16 is connected to the input of a second amplifier 17 including a feedback resistor $R_{f2}$ and again forming an operational amplifier 22. The amplifier is connected to the output terminals 19, one of which is connected to the common voltage previously referred to. The output voltage is obtained across the output terminals 19.

In operation, the amplifier-resistor circuits 21 and 22 are each selected to have a low input current, high input impedance, large dynamic range, low noise and high speed. The amplifier 21 may, for example, be a commercially available amplifier such as Textronix type O operational amplifier. The amplifier serves to amplify a relatively small input signal and provide a greatly amplified output signal.

The transistor 13 has a collector current $$I_c = (\text{constant})(e^{qV_{eb}/kT} - 1) + f(V_{cb})$$

where $V_{eb}$ and $V_{cb}$ are the actual emitter-base and collector-base junction voltages, respectively. The semiconductor lattice and manufacturing techniques will determine $f(V_{cb})$ and the constant. However, for $V_{cb}=0$, $f(V_{cb})$ is also equal to 0 and for this condition (1) $$I_c = (\text{constant})(e^{qV_{eb}/kT} - 1)$$

$\log_e I_c = qV_{eb}/T$ since for most cases 1 is small in comparison to $e^{qV_{eb}/kT}$ This relationship holds for nine decades or more and many transistor types such as indicated by the curve in FIGURE 2.

This relationship of current and voltage is the basis of the logarithm transfer circuit and described in my copending application referred to above.

The characteristics given in Equation 1 above can also be used to perform an antilogarithm operation over a wide range with great accuracy. The antilogarithm operation may be more clearly understood from the following. In order to actually perform the antilogarithm operation, the drive for the emitter-base terminal of the silicon transistor must be from a voltage source whose voltage is proportional to the signal whose antilogarithm is desired. The output antilogarithm should be taken from the output as a short circuit collector current. This is accomplished by the circuit including the operational amplifier 22 described above with reference to FIGURE 1.

The purpose of operational amplifier 21 is to: (1) scale the actual input voltage $e_{in}$ to a magnitude suitable for driving the emitter-base junction of the transistor, for example, between 0.1 and 0.8 volt, which with reference to the curve of FIG. 2, is the change in the voltage desired for obtaining the logarithmic response over the wide range referred to above; and (2) to provide a very low impedance drive for the antilogarithmic transistor 13, that is, to provide a driving source with much less impedance than the resistor $R_s$ connected in series with one input terminal.

The operational amplifier 22 including the amplifier 17 and feedback resistor $R_{f2}$ is an arrangement for measuring the short circuit collector current of the transistor and converting it to an output voltage. By adjusting the amplification and zero drift of the amplifier 17, the input to the operational amplifier 22 can be operated at essentially zero volts which is the requirement for the short circuit current. The output voltage of the circuit will then be (2) $$i_{in} R_{f2} = e_{out}$$

where $i_{in}$ is the collector current.

By using Equation 1, there is obtained (3) $$e_{out} = R_{f2} I_1 (e^{qe_a/kT} - 1)$$

Since operational amplifier 21 makes (4) $$e_a = C e_{in}$$

where $e_{in}$ is the input voltage, $e_a$ is the amplified output voltage and $C$ is a scaling constant, we have (5) $$e_{out} = I_1 R_{f2} [e^{Cqe_{in}/kT} - 1]$$

When (6) $$Cqe_{in}/kT \gtrsim 4$$

we have (7) $$e_{out} = (\text{const})e^{\alpha e_{in}}$$

where (8) $$\alpha = Cq/kT$$

Equation 7 displays the desired relationship of $e_{out}$ proportional to the exponential of $e_{in}$. By multiplying by appropriate constant factors, Equation 7 can be converted to (9) $$e_{out} \sim a^{\alpha e_{in}}$$

where $a$ is any base one chooses.

Thus, it is seen that there is provided an output voltage which is the antilog of the input voltage and wherein the base for which the non-linear operation is carried out can be any base that one selects.

I claim:

1. An antilog transfer circuit comprising:
a transistor having an emitter-base junction and a collector-base junction;
means for applying to said emitter-base junction a voltage signal the antilog of which is desired; and
means for maintaining substantially zero volts across said collector-base junction and for detecting collector current to provide an output signal proportional to the antilog of said voltage signal.

2. An antilog transfer circuit comprising:
a transistor including emitter, base and collector electrodes,
means for applying to said emitter and base electrodes a voltage proportional to a signal the antilog of which is desired, and
means for maintaining a virtual short circuit between said collector and base electrodes to maintain a zero potential between the collector and base electrodes, and for providing a signal output which is a function of the short-circuit collector current.

3. An antilog transfer circuit comprising:
a transistor including emitter, base and collector electrodes, means for applying to said emitter and base electrodes a voltage proportional to a signal the antilog of which is desired,
and a high gain inverting amplifier connected to the collector and base electrodes of said transistor, said amplifier having a feedback impedance element coupling an output terminal thereof to the collector of said transistor to maintain the collector-base voltage of said transistor at zero volts by providing a virtual short circuit between the collector and base electrodes while providing at said output terminal a signal proportional to the short circuit collector current of said transistor.

4. An antilog transfer circuit comprising:
a transistor including emitter, base and collector electrodes,
a low impedance source of a voltage signal the antilog of which is desired connected to said collector and base electrodes,
and a high gain inverting amplifier connected to the collector and base electrodes of said transistor, said amplifier having a feedback impedance element coupling an output terminal thereof to the collector of said transistor to maintain the collector-base voltage of said transistor at zero volts by providing a virtual short circuit between the collector and base electrodes while providing at said output terminal a signal proportional to the short circuit collector current of said transistor.

References Cited by the Examiner

UNITED STATES PATENTS

| | | | |
|---|---|---|---|
| 3,092,779 | 6/1963 | De Niet | 328—145 |
| 3,152,250 | 10/1964 | Platzer | 328—145 |
| 3,197,627 | 7/1965 | Lewis | 328—145 |
| 3,206,619 | 9/1965 | Lin | 307—88.5 |

ARTHUR GAUSS, *Primary Examiner.*

R. H. EPSTEIN, *Assistant Examiner.*